United States Patent
Ueng et al.

(10) Patent No.: US 9,048,872 B2
(45) Date of Patent: Jun. 2, 2015

(54) LAYERED DECODING ARCHITECTURE WITH REDUCED NUMBER OF HARDWARE BUFFERS FOR LDPC CODES

(71) Applicant: National Tsing Hua University, Hsinchu (TW)

(72) Inventors: Yeong-Luh Ueng, Kinmen County (TW); Jyun-Kai Hu, Tainan (TW); Hsueh-Chih Chou, Tainan (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 122 days.

(21) Appl. No.: 13/869,439

(22) Filed: Apr. 24, 2013

(65) Prior Publication Data

US 2014/0281786 A1 Sep. 18, 2014

(30) Foreign Application Priority Data

Mar. 15, 2013 (TW) .............................. 102109208 A

(51) Int. Cl.
*H03M 13/00* (2006.01)
*H03M 13/11* (2006.01)

(52) U.S. Cl.
CPC .......... *H03M 13/114* (2013.01); *H03M 13/112* (2013.01); *H03M 13/1122* (2013.01); *H03M 13/658* (2013.01)

(58) Field of Classification Search
CPC .......... H03M 13/1137; H03M 13/114; H03M 13/116; H03M 13/118; H03M 13/13; H03M 13/1111; H03M 13/1117
USPC .......... 714/763, 758, 774, 752, 801, 786, 761
See application file for complete search history.

(56) References Cited

U.S. PATENT DOCUMENTS

| | | | |
|---|---|---|---|
| 7,174,495 B2 * | 2/2007 | Boutillon et al. | 714/752 |
| 8,359,522 B2 * | 1/2013 | Gunnam et al. | 714/758 |
| 8,489,957 B2 * | 7/2013 | Wesel et al. | 714/752 |
| 2005/0210367 A1 * | 9/2005 | Ashikhmin et al. | 714/801 |
| 2007/0245217 A1 * | 10/2007 | Valle | 714/758 |
| 2009/0063931 A1 * | 3/2009 | Rovini et al. | 714/758 |
| 2010/0031118 A1 * | 2/2010 | Blanksby et al. | 714/752 |
| 2010/0037121 A1 * | 2/2010 | Jin et al. | 714/763 |
| 2011/0161770 A1 * | 6/2011 | Ueng et al. | 714/752 |

* cited by examiner

*Primary Examiner* — David Ton
(74) *Attorney, Agent, or Firm* — Jackson IPG PLLC; Demian K. Jackson

(57) ABSTRACT

A layered decoding architecture with a reduced number of hardware buffers for low-density parity-check (LDPC) decoding by storing a variable-to-check message. When a check node begins a new operation, a variable-to-check message (Q) is added to a check-to-variable message (R) obtained in previous check-node operation to obtain an updated APP value. Then, the R value for the check node in the layer being processed is deducted from the APP value to obtain a variable-to-check message (Q). This variable-to-check message is stored in the memory and inserted into the check node equation to obtain a check-to-variable message. Finally the check-to-variable message obtained in this operation is stored to the check-to-variable message shift register to complete the updating operation for the check node and the variable node for the layer being processed. Improved hardware utilization and fewer buffers, thus achieving a smaller hardware area while retaining the converge speed, is obtained.

7 Claims, 6 Drawing Sheets

$$H = \begin{bmatrix} 0 & 0 & 0 & 0 & 0 & 0 & 1 & 1 & 1 & 1 \\ 0 & 0 & 0 & 1 & 1 & 1 & 0 & 0 & 0 & 1 \\ 1 & 1 & 1 & 0 & 0 & 1 & 0 & 0 & 1 & 0 \\ 1 & 0 & 1 & 0 & 1 & 0 & 0 & 1 & 0 & 0 \\ 1 & 1 & 0 & 1 & 0 & 0 & 1 & 0 & 0 & 0 \end{bmatrix}$$

Fig. 2

LAYERED DECODING ARCHITECTURE WITH REDUCED NUMBER OF HARDWARE BUFFERS FOR LDPC CODES

BACKGROUND OF THE INVENTION

1. Field of the Invention

The present invention relates to a layered decoding architecture which reduces the hardware area and improves hardware utilization while retaining the converge speed, and thus can be applied to the decoding of low-density parity check (LDPC) codes with fewer buffers.

2. Description of Related Art

The concept of the decoding of (LDPC) codes can be referred to in FIG. 2 and FIG. 3. FIG. 3 is a Tanner graph expressing the connection of check nodes to variable nodes in the parity-check matrix shown in FIG. 2. As shown, one row of the parity-check matrix corresponds to a check node and a column corresponds to a variable node. In the parity-check matrix, if the i-th row and the j-th column behave 1, then the check node i and the variable node j in the Tanner graph will be connected by an edge (line). Otherwise, there is no connection between them.

From FIG. 4., variable node j calculates a variable-to-check message Q, using the extrinsic information $R_{i'j}$ obtained from the neighboring check nodes i', except for the check node i, and by using a channel value. This extrinsic information is a message that excludes the information that the receiving check node i already knows. For check node i, the variable-to-check message $Q_{ij}$ from variable node j to check node i will exclude the check-to-variable message $R_{ij}$ from check node i to variable node j. In FIG. 5., check node i uses the variable-to-check information obtained from the neighboring variable node, except for variable node j, to obtain a check-to-variable message $R_{ij}$, which is then sent to variable node j. This extrinsic information is also a message that excludes the information already known by the receiving variable node j. For variable node j, the check-to-variable message $R_{ij}$ from check node i to variable node j will exclude the variable-to-check message $Q_{ij}$ from variable node j to check node i, and other messages obtained will be calculated.

Generally, a decoding process has three phases: variable node processing, check node processing and A Posteriori Probability (APP) processing. The conventional layered decoding architecture is described as follows. Let N (i) be the set of all the variable nodes connected to check node i. Equation (1) is used in the variable node processing phase to obtain the variable-to-check message (Q) for all variable nodes j connected to the check nodes in the check-node layer being processed. Equation (2) is used in the check-node processing phase to obtain the check-to-variable message (R) of all check nodes i in the check-node layer being processed. Equation (3) is used to update the APP value of all the variable nodes j connected to the check node layer being processed after the processing of all check nodes in the check-node layer has been completed according to equation (2). The detailed equations used in the layered decoding algorithm are as follows:

$$Q_{ij} = APP_j - R_{ij}, \forall j \in N(i) \quad (1)$$

$$R_{ij}' = \alpha \lfloor \Pi_{k \in N(i)/\{j\}} \text{sign}(Q_{ik}) \rfloor \min_{k \in N(i)/\{j\}} \{|Q_{ik}|\}, \forall j \in N(i) \quad (2)$$

$$APP_j' = Q_{ij} + R_{ij}', \forall j \in N(i) \quad (3)$$

In equation (2), $\alpha$ is a normalization factor. A conventional layered decoding architecture executes the decoding by storing the APP values. When the check node begins a new operation, the check-to-variable message obtained in the previous decoding iteration will be deducted from the APP value to obtain the variable-to-check message. The variable-to-check message will be buffered, and also inserted into the check node equation to obtain the check-to-variable message, which is then registered in check-to-variable message shift registers and added to the variable-to-check message in the buffer in order to simultaneously obtain an updated APP value at the same time. The updated APP value will then be sent to the APP routing network.

From FIG. 6., when processing a layer, the APP routing network unit 32 retrieves the updated APP values from the APP memory 31 and then routes the updated APP values to ensure that the updated APP values are mapped to their corresponding check nodes. Then, the first calculation unit 33, it retrieves the total product of the variable-to-check message signs, a minimal variable-to-check message magnitude index, and the minimal and the second minimal variable-to-check message magnitudes for the current check-node layer obtained in the previous decoding iteration. The check-to-variable message sign can be obtained from the total product of the variable-to-check message signs and the variable-to-check message sign obtained from the variable-to-check message sign memory 35. The check-to-variable message magnitude can be obtained from the minimal variable-to-check message magnitude index, and the minimal and the second minimal variable-to-check message magnitudes so as to obtain the complete check-to-variable message. Subsequently, the first calculation unit deducts the check-to-variable message from the obtained APP value, as shown by Q=APP-R, to obtain the variable-to-check message. The variable-to-check message will be buffered in the variable-to-check message magnitude buffer 34 and the variable-to-check message sign memory (Q sign memory) 35 and forwarded to the check-node processor 36. The check-node processor 36 includes a comparator 361, a register 362, a normalizer 363, and a check-to-variable message shift register 364. The comparator 361 compares the obtained variable-to-check messages to determine the minimal and the second minimal variable-to-check node magnitudes, the total product of the variable-to-check message signs and the minimal variable-to-check message magnitude index. This minimal variable-to-check message magnitude index includes the location of the variable node corresponding to the minimal variable-to-check message magnitude on a check node. These obtained values are temporarily stored in the register 362. After the check node operation is completed, the final obtained values are sent to the normalizer 363, which normalizes the minimal and the second minimal values, and to the check-to-variable message shift register 364 and the second calculation unit 37. The second calculation unit updates the APP value, as shown by APP=Q+R, to obtain an updated APP value, which is then stored to the APP memory. An APP sign routing network 38 ensures that the APP signs of the updated APP values are routed to each corresponding variable node. Those routed APP signs are stored to the APP sign memory 39 to enable codeword output after decoding is complete.

However, it is necessary to retrieve the check-to-variable message obtained during this iteration in this operation in order to update the APP value. The time required for calculating the check node equation relates to the row weight of the current check-node layer. The higher the row weight, the more time that is required for the check node process. In the conventional architecture, the variable-to-check message (Q) obtained during this operation must be buffered. Before the check node equation in this operation is completed, it needs to buffer the variable-to-check message. Therefore, the size of the buffer is proportional to the row weight.

In the above, for the conventional architecture, the updating process of the APP value in each operation requires the inclusion of the check-to-variable message calculated during this operation. As shown in FIG. 6, in the case where the APP value from the previous operation has not yet been updated, the decoding action in the next operation will be delayed until the updating of the APP value is completed as the corresponding APP values, which are not yet updated. This type of action results in a number of decoding components becoming idle. In addition, until the comparison of the last variable-to-check message magnitude in this operation is finished, the components responsible for updating the APP value cannot work either. Therefore, the performance of the conventional architecture depends on the structure of the parity-check matrix, severely impacting the hardware utilization.

The conventional layered decoding architecture, which stores the APP value and updates the layered computation in turn, also has scheduling problems. Not only is the hardware utilization low, but more variable-to-check message magnitude buffers are also required, thereby increasing the hardware area. Therefore, the conventional architecture cannot meet the needs of users in actual use.

SUMMARY OF THE INVENTION

The main purpose of this invention is to provide a layered decoding architecture which overcomes the shortages of the prior art, effectively reduces the hardware area and improves hardware utilization while retaining the converge speed, and, thus, can be applied to the LDPC codes without the need for redundant buffers, compared to the prior art.

In order to achieve the above and other objectives, the layered decoding architecture with fewer buffers contains the following components:

A variable-to-check node message (Q) magnitude memory, used to store the obtained magnitudes of the channel values as the initial variable-to-check message magnitudes or the later calculated variable-to-check message magnitudes during decoding;

An APP calculation unit, electrically coupled to 1) a variable-to-check message magnitude memory, 2) a variable-to-check message sign memory and 3) a check-to-variable message shift register for, respectively, reading a variable-to-check message magnitude, a variable-to-check message sign, and the total product of the variable-to-check message signs, the minimal variable-to-check message magnitude index, and the minimal and the second minimal variable-to-check message magnitudes. The APP calculation is the summation of a variable-to-check message and a check-to-variable message, as shown by APP=Q+R. The variable-to-check message is the combination of the variable-to-check message magnitude and the variable-to-check message sign. The check-to-variable message is the combination of the check-to-variable message sign, which is a product of the total product of the variable-to-check message signs and the above variable-to-check message sign, and the check-to-variable message magnitude, which can be calculated using the minimal variable-to-check message index, and the minimal and the second minimal variable-to-check message magnitudes. Therefore, the APP calculation unit can update the APP values using both the check-to-variable message and the variable-to-check message.

An APP sign routing network unit, electrically coupled to the APP calculation unit to route the updated APP signs to each corresponding variable node;

An APP sign memory, electrically coupled to an APP sign routing network unit to retrieve the routed and updated APP signs from the APP sign routing network unit to be used during the decoded codeword output;

The APP routing network unit, electrically coupled to the APP calculation unit to route the updated APP value to the corresponding check nodes;

A variable-to-check message calculation unit, electrically coupled to the APP routing network unit, the variable-to-check message sign memory and the check node processor to retrieve the routed APP value, the variable-to-check message sign and the total product of the variable-to-check message signs, the minimal variable-to-check message magnitude index, and the minimal and the second minimal variable-to-check message magnitudes. This unit calculates the variable-to-check message by subtracting the check-to-variable message from the routed APP value, as shown by Q=APP−R. The check-to-variable message is the combination of the check-to-variable message sign, which is the product of the total product of the variable-to-check message signs and the variable-to-check message sign above, and the check-to-variable message magnitude which can be calculated using the minimal variable-to-check message index, and the minimal and the second minimal variable-to-check message magnitudes. Therefore, the variable-to-check message calculation unit can calculate the variable-to-check message using both of the routed APP value and the check-to-variable message. Then, the calculated variable-to-check message whose sign is stored in the variable-to-check message sign memory, and the magnitude that is stored in the variable-to-check message magnitude memory, are then combined and simultaneously forwarded to the check node processor;

A variable-to-check message sign memory, electrically coupled to both the APP calculation unit and the variable-to-check message calculation unit, and provides both of the components with the corresponding stored variable-to-check message sign and stores the variable-to-check message sign obtained from the variable-to-check message calculation unit; and A check-node processor, electrically coupled to both the variable-to-check message calculation unit and the APP calculation unit, comprises a comparator, a register (Reg), a normalizer and a check-to-variable message shift register. The comparator is used to determine the minimal and the second minimal variable-to-check message magnitudes based on the incoming variable-to-check message magnitudes calculated by the variable-to-check message calculation unit. The register is used to temporarily store the following comparison results: the total product of the variable-to-check message signs, the minimal variable-to-check message index, and the minimal and the second minimal variable-to-check message magnitudes. After the check node processing is completed, the above data that is stored in the register will be forwarded to the check-to-variable message shift register together with both of the normalized minimal and the second minimal variable-to-check message magnitudes, which are normalized via the normalizer based on the stored minimal and the second minimal variable-to-check message magnitudes in the register. Then, the values stored in the check-to-variable message shift register are simultaneously forwarded to both the variable-to-check message calculation unit and the APP calculation unit.

In one embodiment, the APP calculation unit updates the APP value using an APP equation for all related variable nodes j connected to the check nodes i in the check-node layer being processed after all these variable nodes j are updated according to the following APP equation:

$$APP_j = Q_{f(i,j)} + R_{f(i,j)}, \forall j \in N(i)$$

where f (i, j) represents the check node which performs the final message delivery together with the variable node j prior to the check node i being processed; and $Q_{f(i,j)j}$ and $R_{f(i,j)j}$ are, respectively, the variable-to-check message and the check-to-variable message corresponding to the check node f (i, j) and the variable node j.

In one embodiment, the variable-to-check message calculation unit processes the variable nodes using the following variable-to-check message equation to obtain the variable-to-check message related to all the check node i of the check-node layer being processed, $$Q_{ij} = APP_j - R_{ij}, \forall j \in N(i)$$

where $APP_j$ represents the APP value updated in the previous operation; and $R_{ij}$ represents the check-to-variable message obtained in the previous decoding iteration.

In one embodiment, the check node processor performs the check-to-variable message calculation according to the following check node equation related to all the check nodes i' of the check-node layer being processed:

$$R_{ij} = \alpha [\Pi_{k \in N(i')/\{j\}} \text{sign}(Q_{i'k})] \min_{k \in N(i')/\{j\}} \{|Q_{i'k}|\}, \forall j \in N(i')$$

BRIEF DESCRIPTION OF THE DRAWINGS

FIG. 2 is a schematic diagram showing a parity-check matrix for low-density parity-check codes (LDPC codes).

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended tables.

Figure 1:
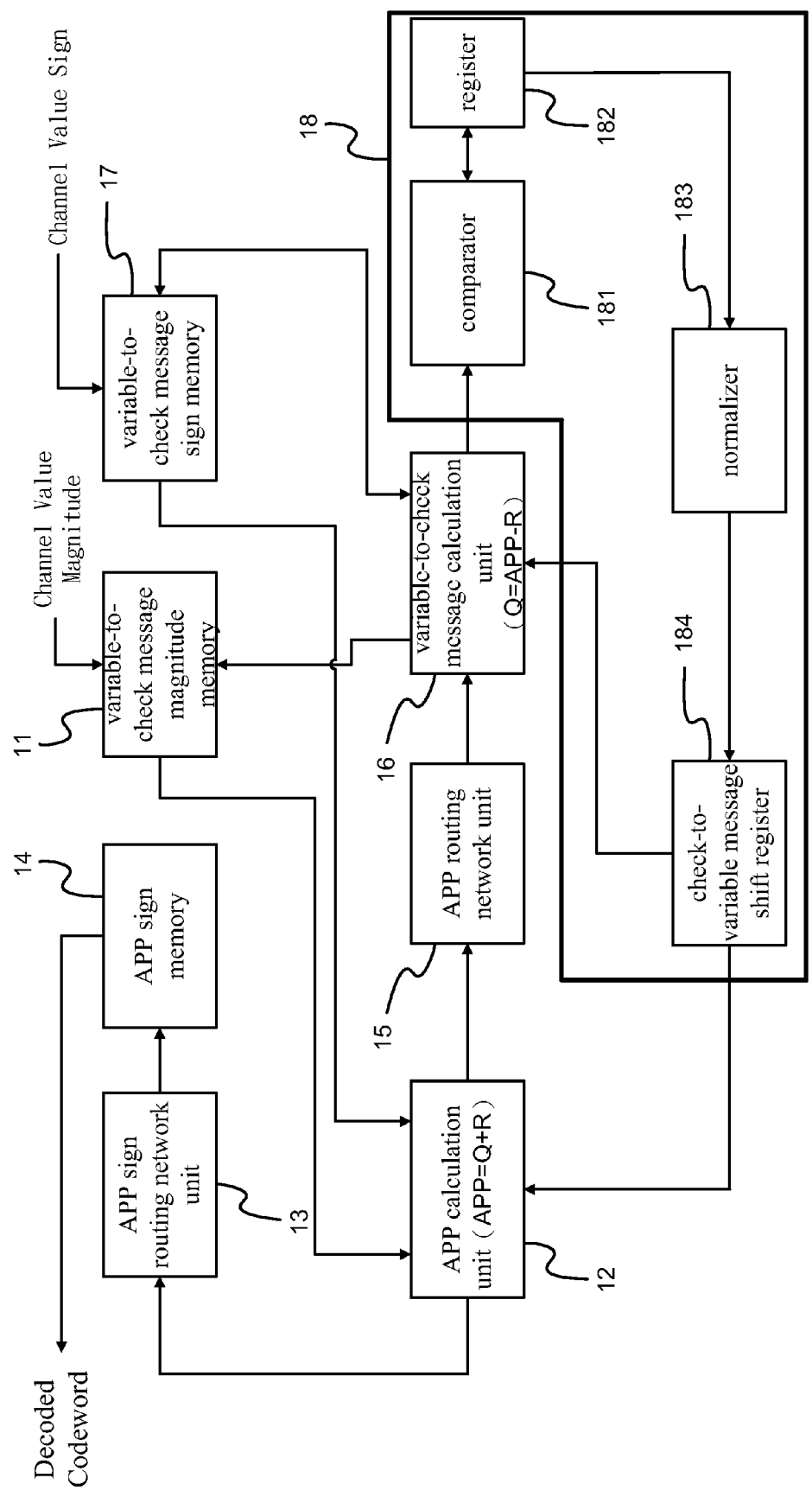
FIG. 1 is a schematic view of a layered decoding architecture based on the invention.
Figure 3:
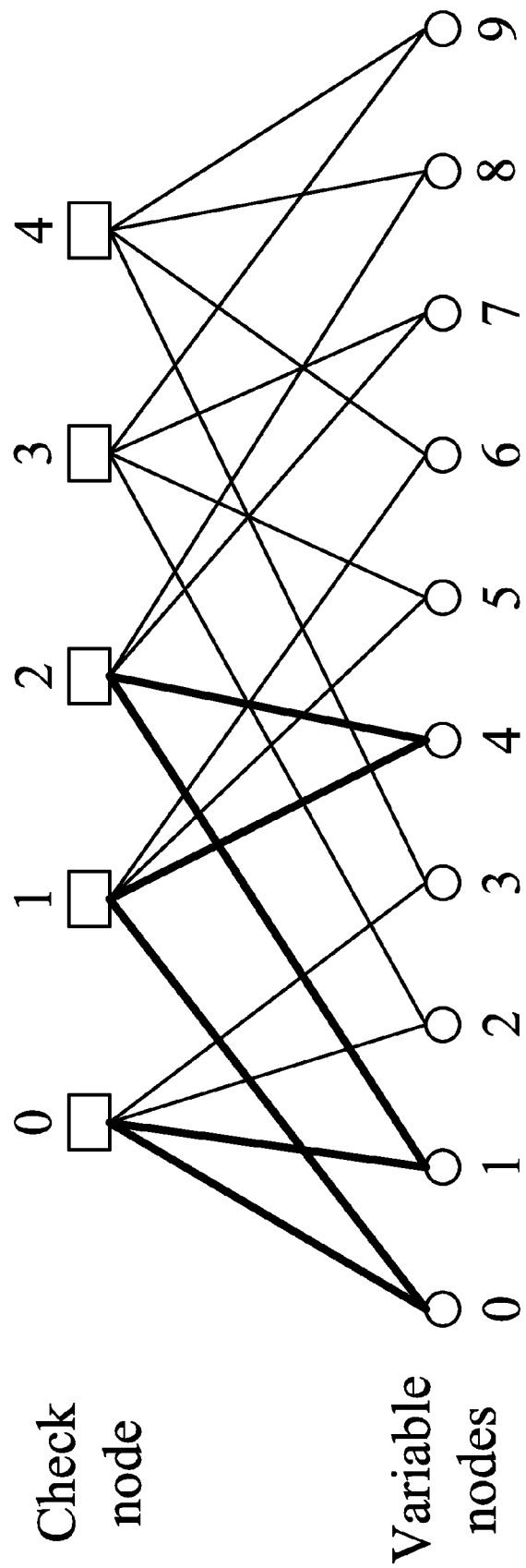
FIG. 3 is a Tanner graph showing the connection of the check nodes to the variable nodes corresponding to the matrix shown in FIG. 2.
Figure 4:
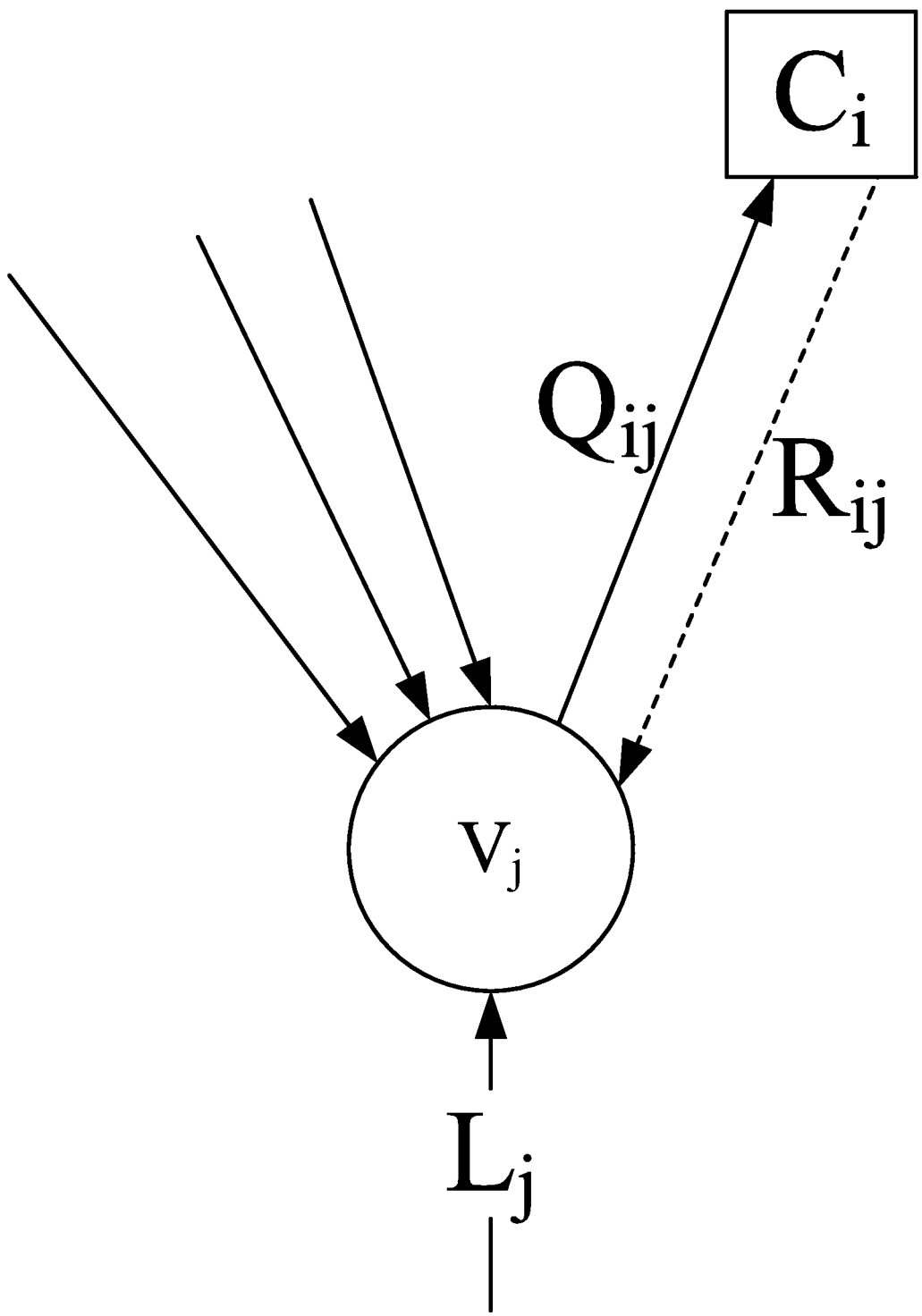
FIG. 4 is a schematic view of the operation of a variable node processor.
Figure 5:
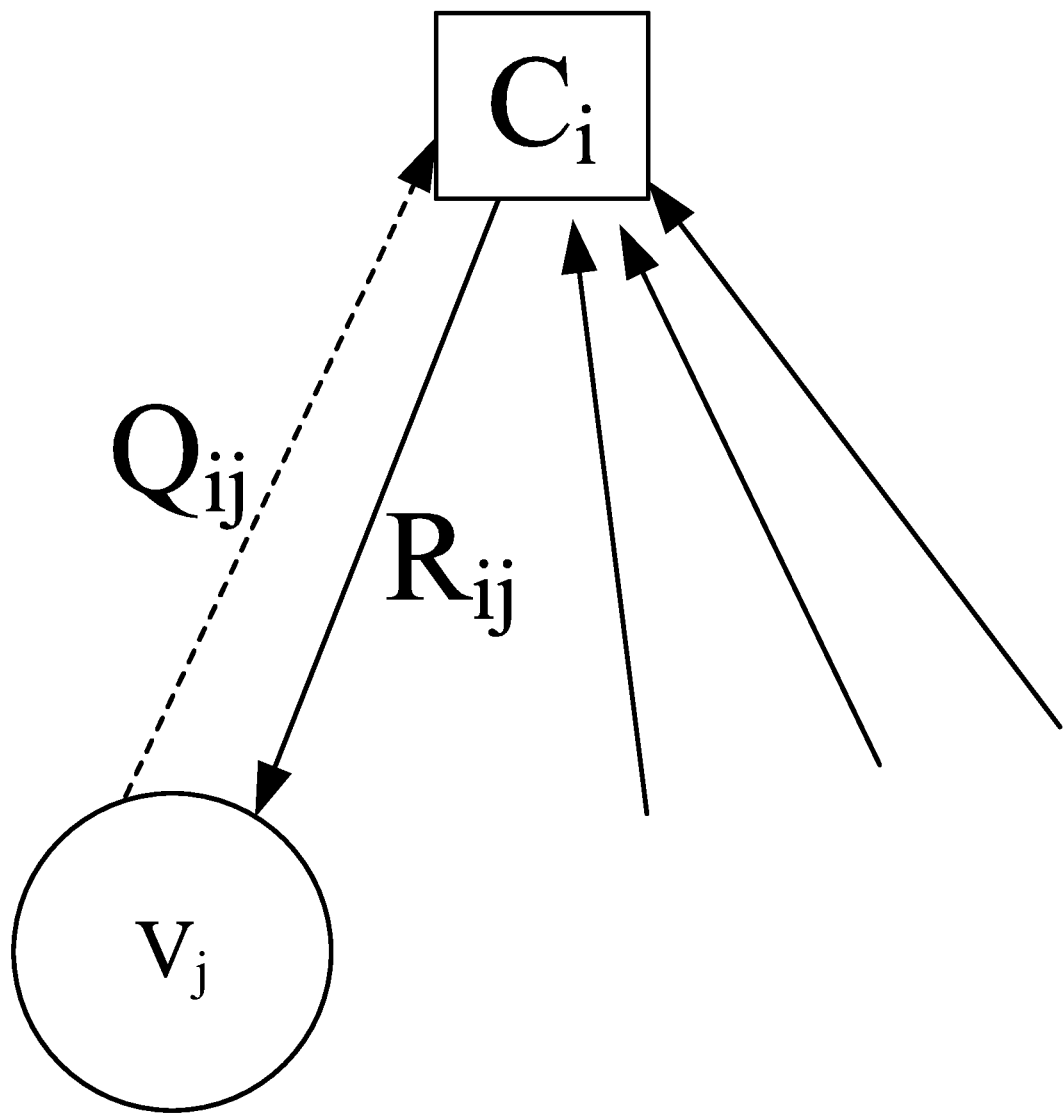
FIG. 5 is a schematic view of the operation of a check node processor.
Figure 6:
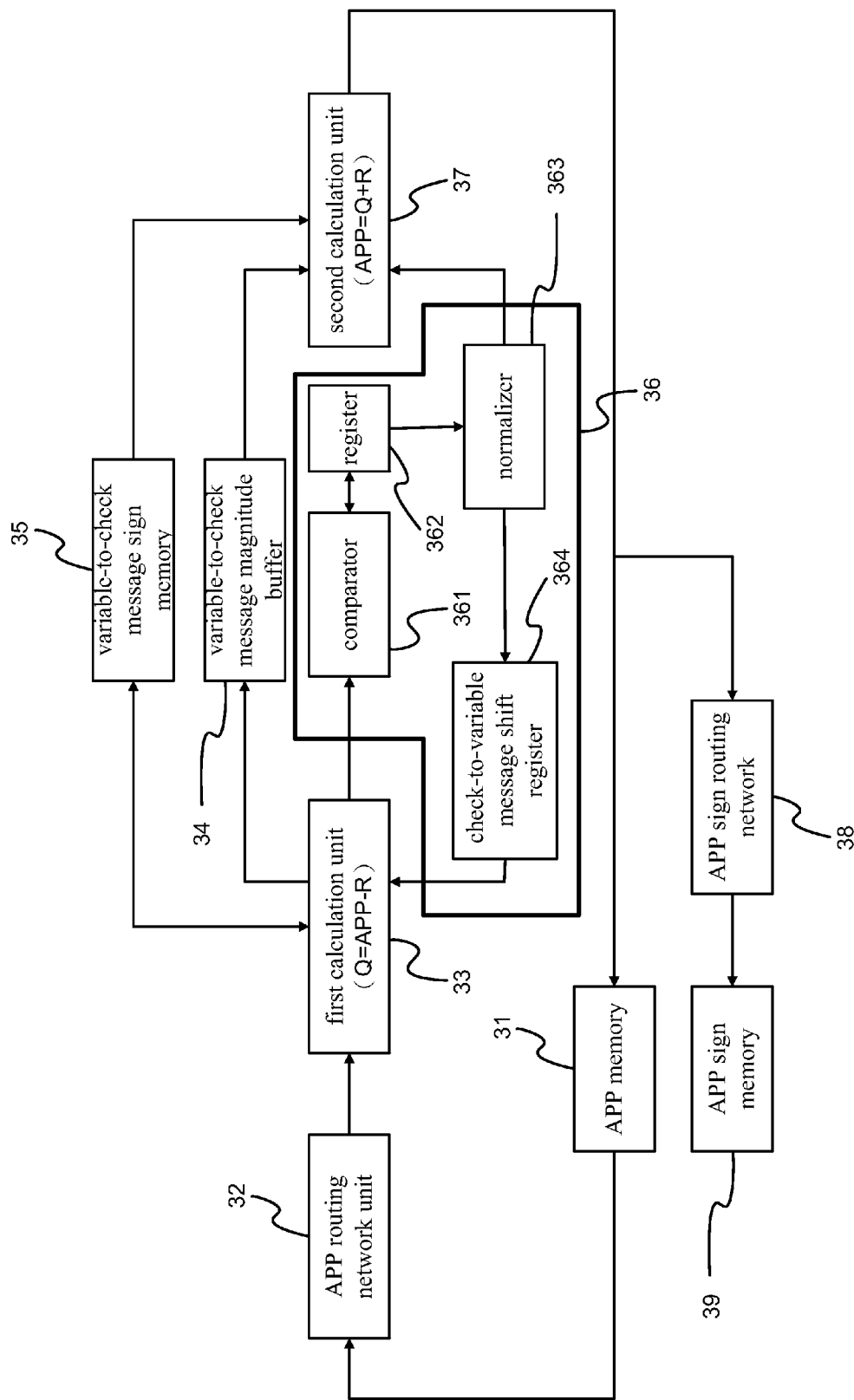
FIG. 6 is a schematic view of a conventional layered architecture.

Refer to FIG. 1, which is a schematic view of a layered decoding architecture with a reduced number of buffers based on the present invention. As shown, the layered decoding architecture with a reduced number of buffers at least includes a variable-to-check message magnitude memory 11, an APP calculation unit 12, an APP sign routing network unit 13, an APP sign memory 14, an APP routing network unit 15, a variable-to-check message calculation unit 16, a variable-to-check message sign memory 17, and a check-node processor 18.

The variable-to-check message magnitude memory 11 stores the obtained magnitudes of channel values as the initial variable-to-check message magnitudes or the later calculated variable-to-check message magnitudes during decoding.

The APP calculation unit 12 is electrically coupled to the variable-to-check message magnitude memory 11, the variable-to-check message sign memory 17 and the check-to-variable message shift register 184 for, respectively, reading a variable-to-check message magnitude, a variable-to-check message sign, and the total product of the variable-to-check message signs, the minimal variable-to-check message magnitude index, and the minimal and the second minimal variable-to-check message magnitudes. The APP calculation is the summation of a variable-to-check message and a check-to-variable message, as shown by APP=Q+R. The variable-to-check message is the combination of the variable-to-check message magnitude and the variable-to-check message sign. The check-to-variable message is the combination of the check-to-variable message sign, which is a product of the total product of the variable-to-check message signs and the above variable-to-check message signs and the check-to-variable message magnitude which can be calculated using the minimal variable-to-check message index, and the minimal and the second minimal variable-to-check message magnitudes. Therefore, the APP calculation unit can update the APP values using both the check-to-variable message and the variable-to-check message.

The APP sign routing network unit 13 is electrically coupled to the APP calculation unit 12 so as to route the updated APP signs to each corresponding variable node.

The APP sign memory 14 is electrically coupled to the APP sign routing network unit 13 so as to retrieve the routed and updated APP signs from the APP sign routing network unit to be used during the decoded codeword output.

The APP routing network unit 15 is electrically coupled to the APP calculation unit 12 so as to route the updated APP value to the corresponding check nodes.

The variable-to-check message calculation unit 16 is electrically coupled to the APP routing network unit 15, the variable-to-check message sign memory 17 and the check node processor 18 to retrieve the routed APP value, the variable-to-check message sign and the total product of the variable-to-check message signs, the minimal variable-to-check message magnitude index, and the minimal and the second minimal variable-to-check message magnitudes. This unit calculates the variable-to-check message by subtracting the check-to-variable message from the routed APP value, as shown by Q=APP−R. The check-to-variable message is the combination of the check-to-variable message sign, which is a product of the total product of the variable-to-check message sign and the variable-to-check message sign above and the check-to-variable message magnitude which can be calculated using the minimal variable-to-check message index, and the minimal and the second minimal variable-to-check message magnitudes. Therefore, the variable-to-check message calculation unit can calculate the variable-to-check message using both the routed APP value and the check-to-variable message. The calculated variable-to-check message whose sign and magnitude are stored in the variable-to-check message sign memory 17 and the variable-to-check message magnitude memory 11, respectively, are then combined and then simultaneously forwarded to check node processor 18.

The variable-to-check message sign memory 17 electrically coupled to both the APP calculation unit 12 and the variable-to-check message calculation unit 16, and provides both of the components with the corresponding stored variable-to-check message sign and stores the variable-to-check message sign obtained from the variable-to-check message calculation unit 16.

The check node processor 18 is electrically coupled to both the variable-to-check message calculation unit 16 and the APP calculation unit 12, and is comprised of a comparator 181, a register (Reg) 182, a normalizer 183 and a check-to-variable message shift register 184. The comparator 181 is used to determine the minimal and the second minimal variable-to-check message magnitudes based on the incoming variable-to-check message magnitudes calculated by the variable-to-check message calculation unit 16. The register 182 is used to temporarily store the following comparison results: the total product of the variable-to-check message signs, the minimal variable-to-check message index, and the minimal and the second minimal variable-to-check message magnitudes. After the check node processing is completed, the above data that is stored in the register 182 will be forwarded to the check-to-variable message shift register 184 together with both of the normalized minimal and the second minimal variable-to-check message magnitudes, which are normalized via the normalizer 183 based on the stored minimal and the second minimal variable-to-check message magnitudes in the register 182. Then, the values stored in the check-to-variable message shift register 184 are simultaneously forwarded to both the variable-to-check message calculation unit 16 and the APP calculation unit 12.

Thereby, a novel layered decoding architecture with reduced number of hardware buffers is constituted.

In the layered decoding architecture of the present invention, the algorithm has N (i) as a set of variable nodes connected to check node i. APP equation (4) is used in the APP calculation unit 12 to update the APP information. The APP for all variable nodes j connected to all check nodes i of the check-node layer being processed can be obtained after check node f (i, j), which is connected to variable node j and performs the final check-to-variable message delivery together with variable node j prior to the check node i being processed, is updated. The variable-to-check message calculation unit 16 executes the variable node processing via variable-to-check message equation (5). The check node processor 18 executes the check node processing based on a check node equation (6), thereby calculating the check-to-variable message related to check node i of the check layer being processed. The details of the algorithm are as follows:

$$APP_j = Q_{f(i,j)j} + R_{f(i,j)j}, \forall j \in N(i) \quad (4)$$

$$Q_{ij} = APP_j - R_{ij}, \forall j \in N(i) \quad (5)$$

$$R_{ij} = \alpha [\Pi_{k \in N(i') \setminus \{j\}} \text{sign}(Q_{i'k})] \min_{k \in N(i') \setminus \{j\}} \{|Q_{i'k}|\}, \forall j \in N(i') \quad (6)$$

where f (i, j) in equation (4) represents the check node which performs the final check-to-variable message delivery together with variable node j prior to the check node i being processed. $Q_{f(i,j)j}$ and $R_{f(i,j)j}$ are, respectively, the variable-to-check message and the check-to-variable message corresponding to check node f (i, j) and variable node j. $R_{ij}$ in equation (5) is the check-to-variable message obtained from the previous decoding iteration for the check node i and the variable node j being processed. $Q_{ij}$ is the variable-to-check message obtained in this operation for the check node i and variable node j being processed. The check-to-variable messages $R_{f(i,j)j}$ and $R_{ij}$ respectively involved in equation (4) and equation (5) can be obtained by replacing i' in equation (6) with f (i, j) and i, where α is the normalization factor, $[\Pi_{k \in N(i') \setminus \{j\}} \text{sign}(Q_{i'k})]$ is the product of the variable-to-check message signs that are forwarded from the variable nodes connected to the check nodes i', except for the variable node j, $\min_{k \in N(i') \setminus \{j\}} \{|Q_{i'k}|\}$ is the minimal variable-to-check message magnitude held by one of the variable nodes in set N(i') except for the variable node j. Thereby a check-to-variable message R is obtained.

As shown in FIG. 1, when the layered decoding architecture according to the present invention is applied, LDPC codes can be decoded via the stored variable-to-check messages. When the check node begins a new operation, a variable-to-check message (Q) can be obtained from the variable-to-check message magnitude memory and the variable-to-check message sign memory. The obtained variable-to-check message (Q) is added to the check-to-variable message (R) in the previous check-node operation to obtain an up-to-date APP value, as shown in APP equation (4); the R value obtained in the previous decoding iteration is subtracted from the up-to-date APP value received from the APP routing network so as to obtain a variable-to-check message (Q), as shown in variable-to-check message equation (5). Then, the calculated variable-to-check message whose sign and magnitude are stored in the variable-to-check message sign memory and the variable-to-check message magnitude memory, respectively, are simultaneously forwarded to the check node processor. The check node processor is comprised of a comparator, a register, a normalizer and a check-to-variable message shift register. The comparator is used to determine the minimal and the second minimal variable-to-check message magnitudes based on the incoming variable-to-check message magnitudes calculated by the variable-to-check message calculation unit. The register is used to temporarily store the following comparison results: the total product of the variable-to-check message signs, the minimal variable-to-check message index, and the minimal and the second minimal variable-to-check message magnitudes. After the check node processing is completed, the above data that is stored in the register will be forwarded to the check-to-variable message shift register together with both of the normalized minimal and the second minimal variable-to-check message magnitudes, which are normalized via the normalizer based on the stored minimal and the second minimal variable-to-check message magnitudes in the register. Then, the values stored in the check-to-variable message shift register are simultaneously forwarded to both the variable-to-check message calculation unit and the APP calculation unit.

Compared to the prior art, the invention offers the following advantages.

1. The architecture of the present invention does not store the APP value but the variable-to-check message in the memory. Therefore, it only needs to add the check-to-variable message obtained in the previous check-node operation to the variable-to-check message stored in the memory to obtain an updated APP value for each variable node connected to the check nodes in the check-node layer being processed. Then, the R value of the check nodes in the check-node layer being processed is deducted from the updated APP value, and this message is stored to the memory and also inserted into the check node processor. This approach can effectively improve the hardware utilization.

2. The present invention only requires the check-to-variable message obtained in the previous check-node operation and the check-to-variable message obtained in the previous decoding iteration in the same check-node layer to achieve the purpose of reducing the hardware area. Therefore, the updating of the APP value can be delayed until the next operation. i.e., as soon as the APP value is updated, the variable-to-check message (Q) required for the check node equation in this operation can be obtained and then inserted into the check node equation for calculation. In this way, time spent waiting for the calculation of the check node equation in order to update the APP value is eliminated. This invention can achieve the same convergence speed using a significantly reduced number of buffers.

3. This invention can effectively improve hardware utilization. As shown in FIG. 1, in this architecture, when a new check node equation operation begins, the previous APP value is updated first, followed by an APP shift to ensure that all values are mapped to the corresponding check nodes. Then the variable-to-check message is calculated to determine the total product of the variable-to-check message signs, the minimal variable-to-check message index, the minimal and the second minimal variable-to-check message magnitudes. This series of operations can be executed at the same time without causing any conflicts, effectively improving the hardware utilization.

4. In the present invention, the APP update process is only executed when there is a need for the execution of the check node processing. There are no overlap in the last operation remaining until the operation requires the APP update. Therefore, the invention won't wait for unnecessary APP updating and prevents any time lag caused by the calculation of the check node equation. This distinguishes the invention from the prior art, and grants the invention improved hardware utilization.

5. The invention requires no additional buffer for the variable-to-check message magnitude, compared to the prior art. Therefore, the hardware area can be significantly reduced. In one embodiment of the invention where a (number of variable nodes, number of check nodes)=(9300, 900) parity matrix is exemplified for illustration, the row weights of the code is 62, the column weight of the code is 6, and one check-node layer has 150 check nodes. In addition, eight bits are used for quantification of the variable-to-check message magnitude. Compared to the invention, the prior art requires additional 74400 bit (9300*8=74400) of buffer to store the variable-to-check message magnitude.

The layered decoding architecture using a reduced number of buffers based on the present invention effectively reduces the hardware area and improves hardware utilization, and can be applied to the decoding of LDPC codes, which achieves better hardware utilization with fewer buffers compared to the prior art.

In summary, the layered decoder based on the architecture of the present invention can effectively improve the shortcomings of the prior art, can effectively reduce the area and enhance hardware utilization and use fewer buffers compared to the prior art. The convergence speed is not reduced, which makes the invention more progressive, more practical, and more in line with the needs of users.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A layered decoding architecture for low density parity check (LDPC) decoding comprising:
   a variable-to-check message magnitude memory configured to store obtained magnitudes of channel values as initial or later calculated variable-to-check message magnitudes;
   an A Posteriori Probability (APP) calculation unit electrically coupled to the variable-to-check message magnitude memory and configured to sum a variable-to-check message (Q) and a check-to-variable message (R), APP=Q+R;
   an APP sign routing network unit electrically connected to the APP calculation unit so as to route updated APP signs to each corresponding variable node;
   an APP sign memory electrically connected to the APP sign routing network unit so as to retrieve routed and updated APP signs;
   an APP routing network unit electrically connected to the APP calculation unit so as to route updated APP values to corresponding check nodes;
   a variable-to-check message calculation unit electrically connected to the APP routing network unit;
   a variable-to-check message sign memory electrically connected to the APP calculation unit and to the variable-to-check message calculation unit so as to provide corresponding stored variable-to-check message signs and store variable-to-check message signs obtained from the variable-to-check message calculation unit; and
   a check-node processor electrically connected to the APP calculation unit and to the variable-to-check message calculation unit,
   wherein the APP calculation unit updates the APP values for all related variable nodes j connected to the check nodes i in the check-node layer being processed after all these variable nodes j are updated according to the following APP equation:

$$APP_j = Q_{f(i,j)j} + R_{f(i,j)j}, \forall j \in N(i)$$

where f(i, j) represents the check node which performs the final check-to-variable message delivery together with the variable node j prior to the check node i being processed, $Q_{f(i,j)j}$ and $R_{f(i,j)j}$ are, respectively, the variable-to-check message and the check-to-variable message corresponding to check node f(i, j) and variable node j.

2. The architecture of claim 1, wherein the variable-to-check message is the combination of the variable-to-check message magnitude and the variable-to-check message sign and wherein the check-to-variable message is the combination of the check-to-variable message sign equal to a product of the total product of the variable-to-check message signs, the variable-to-check message signs, and the check-to-variable message magnitude which is calculated using a minimal variable-to-check message index and minimal and second minimal variable-to-check message magnitudes.

3. The architecture of claim 1, wherein the variable-to-check message calculation unit retrieves the routed APP value, the variable-to-check message sign and a total product of the variable-to-check message signs, a minimal variable-to-check message magnitude index, and a minimal and second minimal variable-to-check message magnitudes and then calculates the variable-to-check message by subtracting the check-to-variable message from the routed APP value, Q=APP−R.

4. The architecture of claim 3, wherein the check-to-variable message is a combination of the check-to-variable message sign, which is a product of the total product of the variable-to-check message sign and the variable-to-check message sign and the check-to-variable message magnitude which is calculated using the minimal variable-to-check message index and the minimal and the second minimal variable-to-check message magnitudes such that the variable-to-check message calculation unit calculates the variable-to-check message using both the routed APP value and the check-to-variable message.

5. The architecture of claim 1, wherein the calculated variable-to-check message and sign and magnitude thereof as stored in the variable-to-check message sign memory and the variable-to-check message magnitude memory, respectively, are then combined and then simultaneously forwarded to the check node processor.

6. A layered decoding architecture for low density parity check (LDPC) decoding comprising:

a variable-to-check message magnitude memory configured to store obtained magnitudes of channel values as initial or later calculated variable-to-check message magnitudes;

an A Posteriori Probability (APP) calculation unit electrically coupled to the variable-to-check message magnitude memory and configured to sum a variable-to-check message (Q) and a check-to-variable message (R), APP=Q+R;

an APP sign routing network unit electrically connected to the APP calculation unit so as to route updated APP signs to each corresponding variable node;

an APP sign memory electrically connected to the APP sign routing network unit so as to retrieve routed and updated APP signs;

an APP routing network unit electrically connected to the APP calculation unit so as to route updated APP values to corresponding check nodes;

a variable-to-check message calculation unit electrically connected to the APP routing network unit;

a variable-to-check message sign memory electrically connected to the APP calculation unit and to the variable-to-check message calculation unit so as to provide corresponding stored variable-to-check message signs and store variable-to-check message signs obtained from the variable-to-check message calculation unit; and a check-node processor electrically connected to the APP calculation unit and to the variable-to-check message calculation unit, wherein the variable-to-check message calculation, unit produces the variable-to-check message $Q_{ij}$ for variable node j related to all the check nodes i in the check-node layer being processed using the following variable-to-check message equation, $$Q_{ij}=APP_j-R_{ij}, \forall j \in N(i)$$

where $APP_j$ represents the APP value updated in the previous operation for variable node j; and $R_{ij}$ represents the check-to-variable message from check node i to variable node j obtained in the previous decoding iteration.

7. A layered decoding architecture for low density parity check (LDPC) decoding comprising:

a variable-to-check message magnitude memory configured to store obtained magnitudes of channel values as initial or later calculated variable-to-check message magnitudes;

an A Posteriori Probability (APP) calculation unit electrically coupled to the variable-to-check message magnitude memory and configured to sum a variable-to-check message (Q) and a check-to-variable message (R), APP=Q+R;

an APP sign routing network unit electrically connected to the APP calculation unit so as to route updated APP signs to each corresponding variable node;

an APP sign memory electrically connected to the APP sign routing network unit so as to retrieve routed and updated APP signs;

an APP routing network unit electrically connected to the APP calculation unit so as to route updated APP values to corresponding check nodes;

a variable-to-check, message calculation unit electrically connected to the APP routing network unit;

a variable-to-check message sign memory electrically connected to the APP calculation unit and to the variable-to-check message calculation unit so as to provide corresponding stored variable-to-check message signs and store variable-to-check message signs obtained from the variable-to-check message calculation unit; and a check-node processor electrically connected to the APP calculation unit and to the variable-to-check message calculation unit, wherein the check node processor performs the check-to-variable message calculation according to the following check node equation related to all the check nodes i' in the check-node layer being processed:

$$R_{i'j}=\alpha \lfloor \Pi_{k \in N(i')/\{j\}} \text{sign}(Q_{i'k}) \rfloor \min_{k \in N(i')/\{j\}} \{|Q_{i'k}|\}, \forall j \in N(i')$$

where $\alpha$ is the normalization factor, $\lfloor \Pi_{k \in N(i')/\{j\}} \text{sign}(Q_{i'k}) \rfloor$ is the product of the variable-to-check messages signs that are forwarded from the variable nodes connected to the check nodes i', except for the variable node j, $\min_{k \in N(i')/\{j\}} \{|Q_{i'k}|\}$ is the minimal variable-to-check message magnitude held by one of the variable nodes in set N(i') except for the variable node j; and thereby the check-to-variable message $R_{i'j}$ from check node i' to variable node j is obtained.

* * * * *